United States Patent
Bird et al.

[11] Patent Number: 5,644,233
[45] Date of Patent: Jul. 1, 1997

[54] QUENCH PROTECTION FOR ACTIVELY SHIELDED MAGNETS

[75] Inventors: John Maurice Bird, Oxfordshire Ox; Alan George Andrew Marcel Armstrong, Oxon Ox, both of England

[73] Assignee: Elscint Ltd., Haifa, Israel

[21] Appl. No.: 605,666

[22] Filed: Feb. 22, 1996

[51] Int. Cl.$^6$ ............................ G01V 3/00
[52] U.S. Cl. ............................ 324/318; 324/319
[58] Field of Search ..................... 324/318, 319, 324/320, 322; 335/296; 128/653.5

[56] References Cited

U.S. PATENT DOCUMENTS

| | | | |
|---|---|---|---|
| 4,926,289 | 5/1990 | Reichert | 324/319 |
| 4,956,608 | 9/1990 | Dorri et al. | 324/319 |
| 5,012,217 | 4/1991 | Palkovich et al. | 335/301 |
| 5,329,266 | 7/1994 | Soeldner et al. | 324/319 |
| 5,343,182 | 8/1994 | Ohta | 324/319 |
| 5,426,366 | 6/1995 | Overweg et al. | 324/319 |

FOREIGN PATENT DOCUMENTS 0240935 10/1987 European Pat. Off.

*Primary Examiner*—Louis M. Arana
*Attorney, Agent, or Firm*—Greenblum & Bernstein, P.L.C.

[57] ABSTRACT

This invention is concerned with actively shielded magnetic resonance (MR) devices and more particularly with protecting such systems in the event of a quench by preventing changes in the stray field outside the magnetic devices. The invention includes dividing the system's coils into groups each comprised of inner and outer coils and arranged so that the net dipole moment, and the contribution to stray field from each group is always close to zero. Each group is connected in parallel to a protective unit, for example a resistor, so that the excess current can flow through the protective unit in the event of a quench; thus avoiding the burnout of the system's coils.

13 Claims, 6 Drawing Sheets

QUENCH PROTECTION FOR ACTIVELY SHIELDED MAGNETS

FIELD OF INVENTION

This invention is concerned with magnetic resonance (MR) diagnostic imaging devices and more particularly with a quench protective system for an MRI magnet with active shielding.

BACKGROUND OF THE INVENTION

MRI systems, used for diagnostic imaging, usually use superconducting coils to generate the necessary high intensity DC magnetic field and some type of a shield to prevent stray field from entering spaces where the general public has access. The maximum field to which the public may be exposed is 0.5 MT (5 Gauss) and the magnet shielding system must control the stray field under all operating conditions.

There are two basic methods for shielding the MRI magnet. The first method is called passive shielding and involves placing a conventional ferromagnetic shielding (usually iron) around the MRI superconducting magnet in form of a return Yoke.

The second method of shielding magnets is called active shielding. In active shielding MRI systems there are two sets of coils: a first set of coils is responsible for the main homogenous magnetic field and a second coil system is used as the active shielding.

Usually the coils are made of low temperature superconductive material. If such a magnet would be subdivided by resistors, then in the event of a quench, the different currents in the different magnet sections would cause the 5 Gauss contour temporarily to appear much further from the magnet than in the normal running condition. One solution of those skilled in the art required building active shielding magnets from excessively heavy and expensive conductors. Thus there remains a need for means for protecting the superconducting coils in active shielding MRI systems from burning up during a quench without using heavy and expensive conductors and without increasing the stray field created by such systems.

An inherent problem associated with superconducting coils is protecting them against burn-out in the event of a quench. A quench is superconductor is caused by a mechanical disturbance in the superconductor itself, which causes a loss of superconductivity. This phenomenon results in a process where energy stored in the magnetic field is dissipated as heat in the coils. If the coils are not properly protected there is a risk that they will burn out during a quench.

For preventing the coils from burning out during a quench in passive systems two solutions are suggested. The first solution is the use of excess copper stabilizer in the superconducting wires. This protective method is expensive. The second solution uses internal subdivision of the superconducting coils and shunting by means of protective resistors and diodes. For example some prior art systems use semiconductor diodes for this purpose and other prior art systems use ohmic protective resistors for the same purpose. These arrangements do prevent burn out in passive systems but fail to control the stray fields and do not address the quench problem of active systems.

BRIEF DESCRIPTION OF THE INVENTION

According to the present invention, an improved actively shielded magnetic resonance imaging system is introduced. The improved system protects its superconducting coils from burning out as well as maintains stray fields of the system unchanged in the event of a quench, said system comprises:
    an active shielded magnet and a plurality of protective resistors.

said active shielded magnet including:
    inner magnet coils with forward going current and outer magnet coils with backward going current,
    the inner and outer magnet coils being electrically arranged in groups so that the current running through all coils in a group is identical in magnitude,
    said groups of coils each comprising coil pairs,
    each coil pair in a group including a first coil from said inner magnet coils and a second coil from said outer magnet coils,
    both said first and second coils in the pair having the same dipole moment, so that their net dipole moment and contribution to the stray field of the magnet from said coil pair is always close to zero, and
    each of said electrically arranged groups being electrically connected in parallel to a protective resistor.

In the event of a quench in any of the group of coils, the resistance of the coils will increase considerably, causing the current to flow mostly through the protective resistors. Thus the superconducting coils will not heat up enough to burn out. Furthermore, since each group is made of a plurality of pairs, and each pair has a net dipole moment and contribution to stray field of the magnet which is close to zero, the stray field will not increase as a result of the quench.

BRIEF DESCRIPTION OF THE DRAWINGS

The above described and other objects and features of the present invention will be best understood when considered in the light of the following description made in conjunction with the accompanying drawings; wherein.

GENERAL DESCRIPTION

Figure 1:
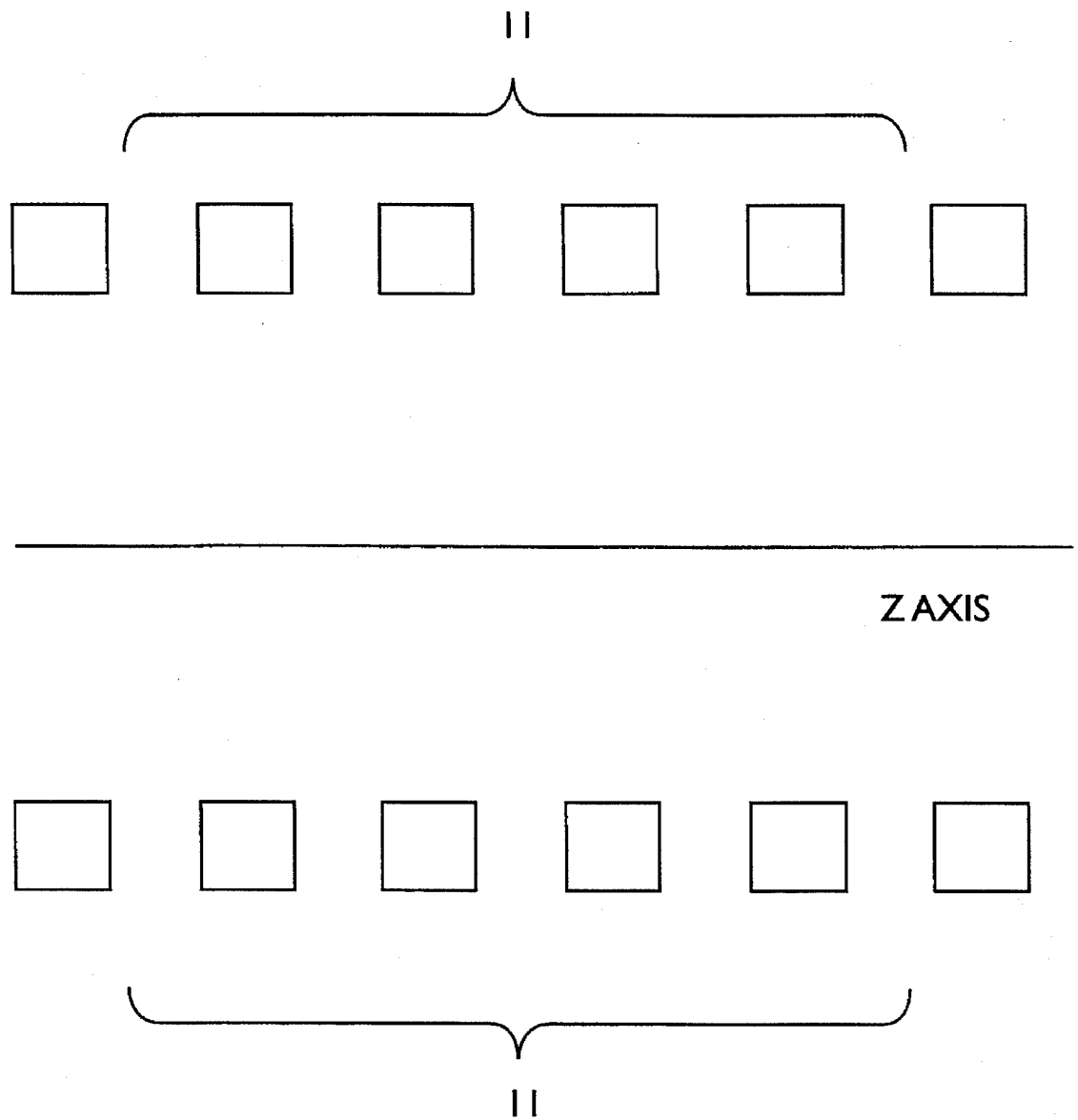
FIG. 1 is an example of a prior art coil arrangement in a MRI system with conventional shielding.
Figure 2:
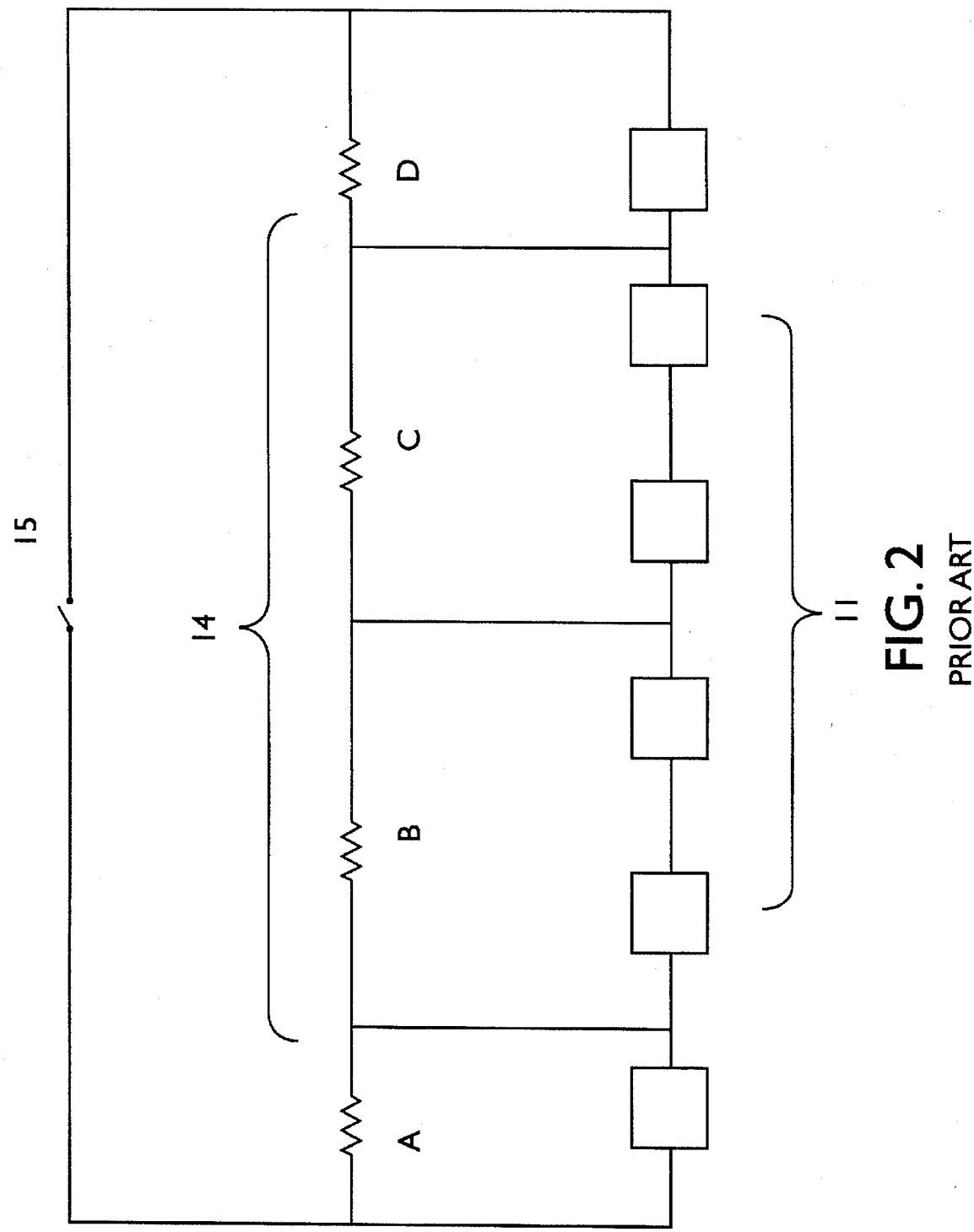
FIG. 2 is a diagrammatic showing of a prior art arrangement of sectionalized divisors of the coils and the use of protective resistors in a conventional MRI system.

FIG. 1 shows a coil arrangement 11 for a conventional MRI system. FIG. 2 shows how such a system can be divided internally into sections and protected by resistors 14 as known in prior art. The coils are connected in a superconducting circuit through a switch 15. In the event of a quench in one of the sections, current in that section is caused to rapidly fall as the internal resistance of the section increases, and current flows through the alternative path of the protecting resistor. Thus large temperature rises in the superconducting coil itself are avoided. If the quenching process continues to other sections of the magnet, and even if every section of the superconducting coil contains a quenching coil, the magnet will still not burn out because the energy originally stored in the magnetic field will be dissipated in the plurality of resistors, and so the resulting temperature rises will be less intense.

Figure 3:
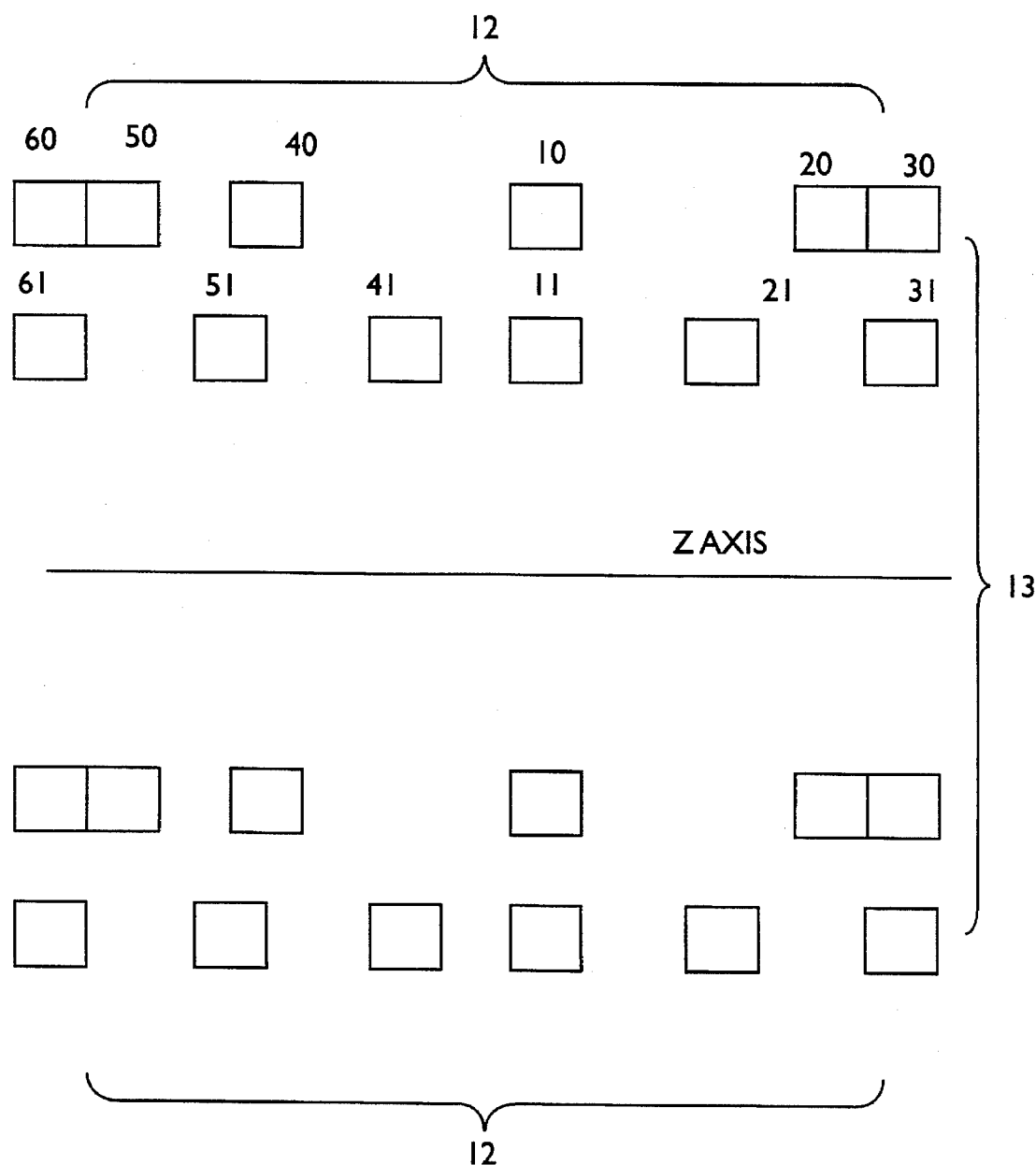
FIG. 3 is an example of the coil arrangement in a MRI system with active shielding.

FIG. 3 shows the coil arrangement in an actively shielded MRI system. A first set of coils 13 preferably constructed from a superconducting material is placed around the Z axis as indicated in FIG. 3. This set of coils which carries a forward going current is also referred to as the main set of coils. A second set of coils 12 is placed outside the main set of coils and coaxial with it. Both coil sets can be connected in series to a power supply (not shown in the drawing) so that the magnet can be energized. A current opposite to the current supplied to the main set of coils which create the main magnetic field of the MRI), is supplied to the second set of coils 12 referred to as the shielding coils. When the magnet is energized, the first and second coil sets are arranged in space so that a strong and homogenous magnetic field is generated inside the magnet and the stray field measured outside the magnet is close to zero.

Figure 4:
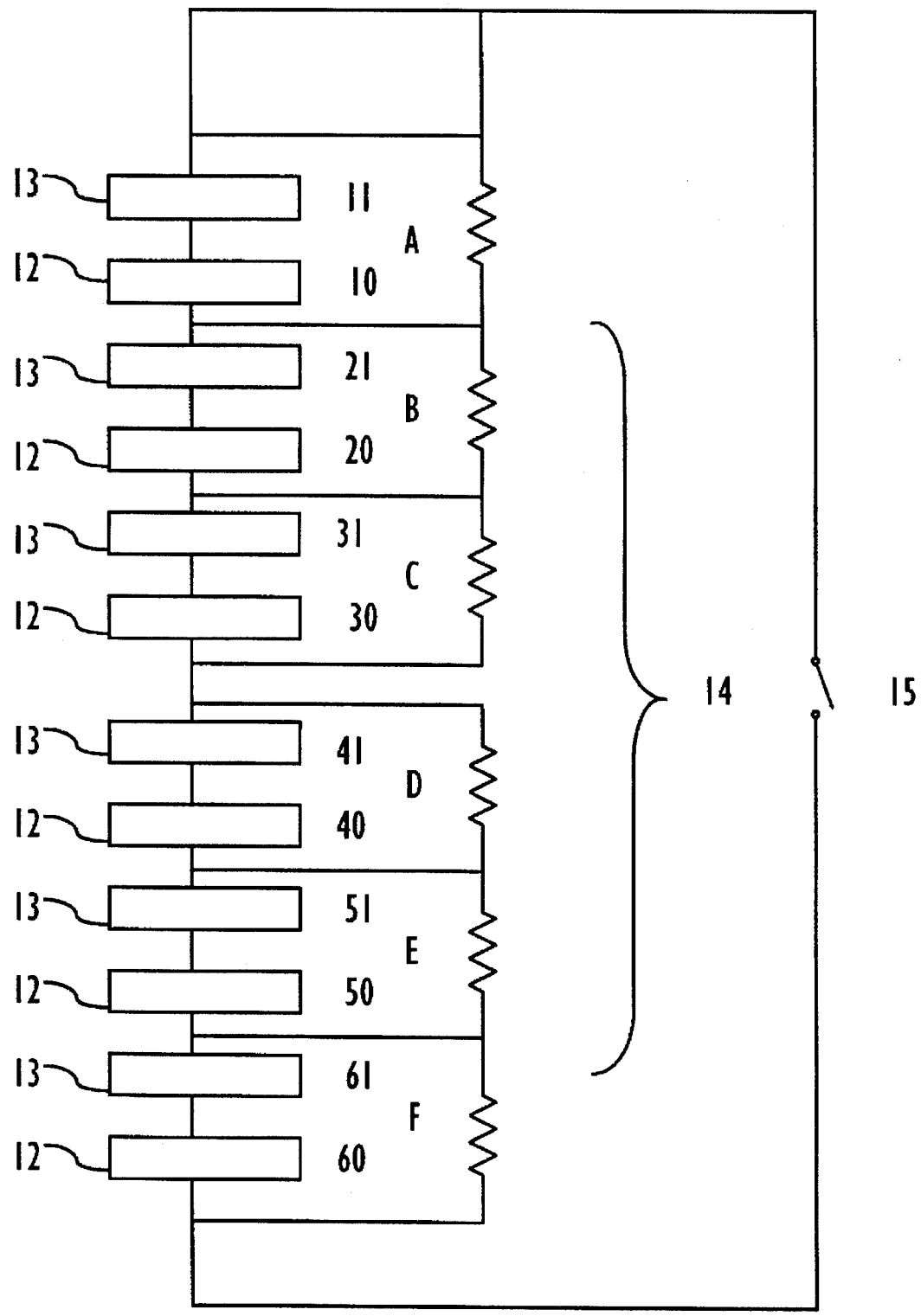
FIG. 4 is a diagrammatic showing of one embodiment of Applicants invention including dividing the coils into pairs and using protective resistors.

The diagram of FIG. 4 shows one embodiment of the invention. All of the coils of the coils sets 12 and 13 are connected in series. The coils 11, 21, 31, 41, 51 and 61 make up coil set 13. The coils 10, 20, 30, 40, 50 and 60 make up coil set 12. The inner coil set 13 and outer coil set 12 are electrically arranged in pairs A–F. Each pair consists of one coil from the first set of coils 13, the main magnet coils, and one coil from the second set of coils, the outer coils or shield coils 12. Each pair is electrically connected bridging a protective resistor 14.

Both the first and the second coils in a pair have the same dipole moment, so that their net dipole moment and contribution to stray field of the magnet from said coil pair is always close to zero.

In the event of a quench in a certain pair of coils, their resistance will increase considerably, causing the current to flow mostly through the protective resistor connected in parallel to this pair. Thus the superconducting coils will not heat and burn up. Furthermore since each pair has a net dipole moment and contribution to stray field of the magnet which is close to zero the stray field will not increase as a result of the quench. For example in the event of a quench in section B (FIG. 4) of the coil system, including coils 12B and 13B the current will mostly flow through the resistor of that section 14B.

There is no restriction on the number of coil pairs which can appear in a protected section. There is no limit on the number of coils in an active shielded magnet, or on the number of separate windings which can be considered as a single coil, provided that the net dipole moment in any protected section is arranged to be zero. Thus another embodiment of applicant's invention can include dividing the coils into groups, where each group consists of a plurality of coil pairs as described hereinabove. Since each group is made of a plurality of pairs, and each pair has a net dipole moment and contribution to stray field of the magnet which is close to zero again the stray field will not increase as a result of the quench, and the coils will be protected by the resistors from burning up during a quench.

Figure 5:
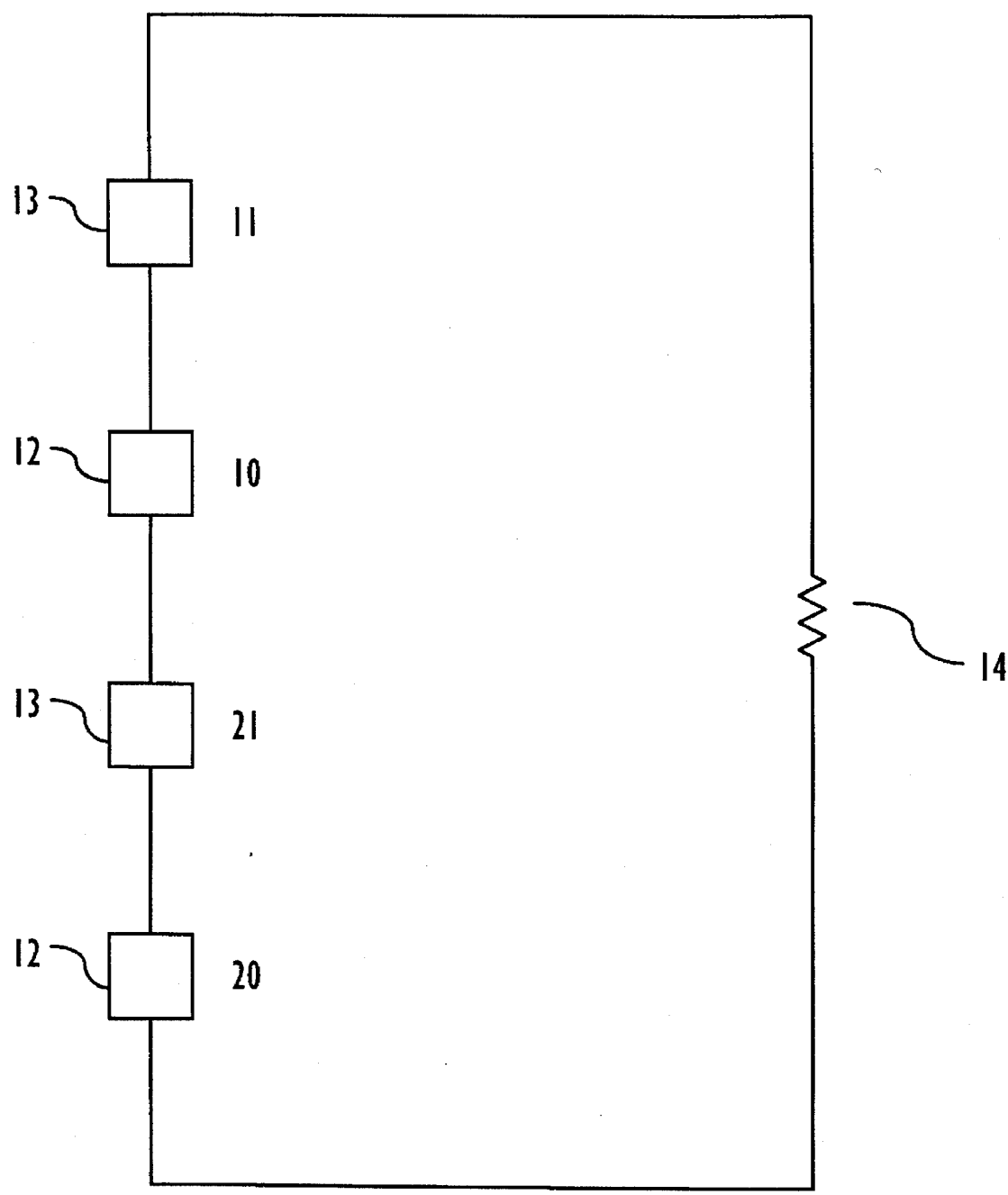
FIG. 5 is a diagrammatic showing of another embodiment of Applicants invention including dividing the coils into groups and using protective resistors.
Figure 6:
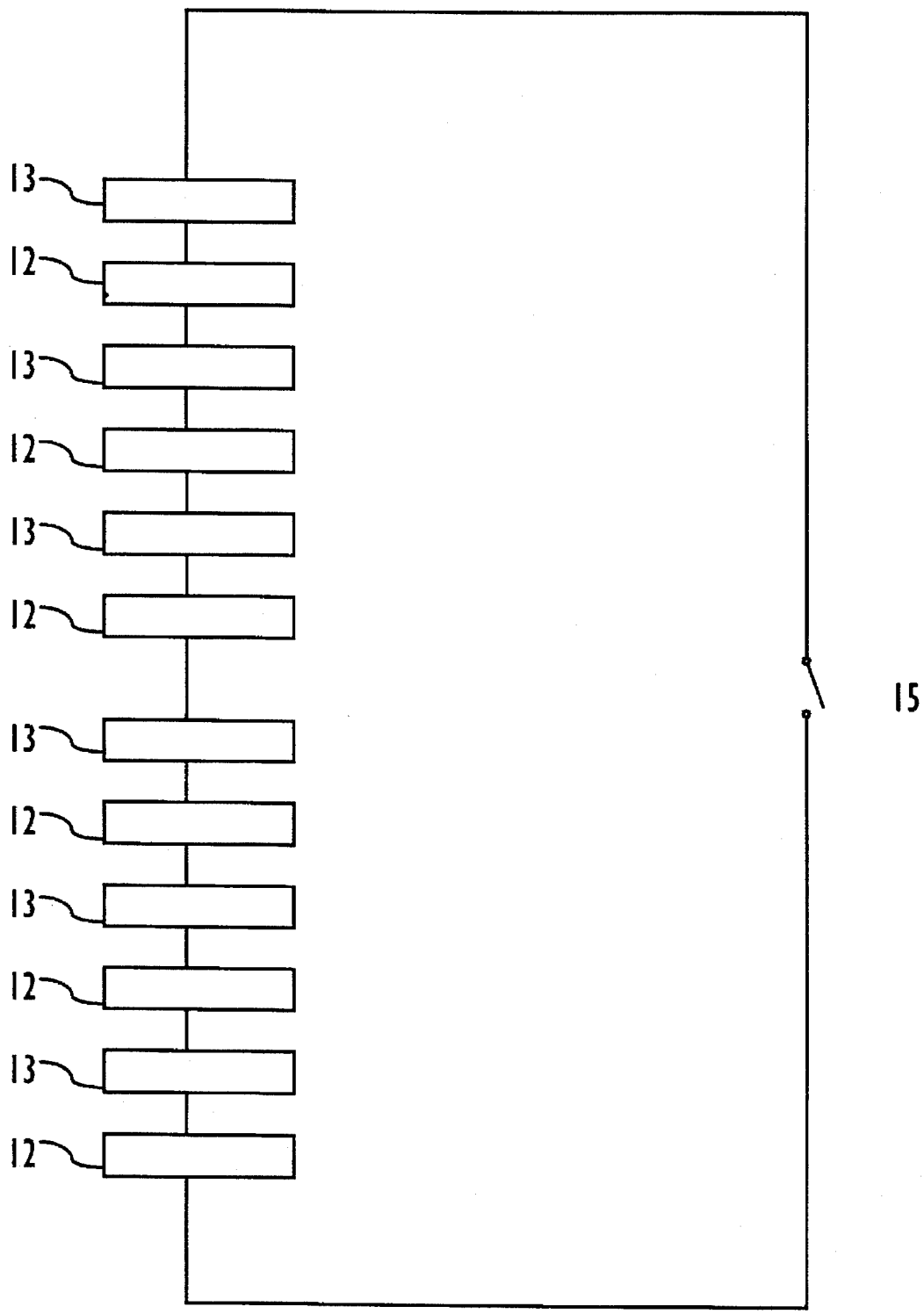
FIG. 6 is an example of a prior art electrical arrangement of the coils in an actively shielded MRI system.

An example of grouping coil pairs is demonstrated in FIG. 5, where coil pairs 10, 11 and 20, 21 are grouped and connected to a single protection resistor.

An active shield magnet constructed on the above principle offers considerable saving in weight and cost of conductors, and in total weight, compared with previous designs suggested for protecting the coils in MRI systems. Furthermore, the system keeps the stray field of the magnet basically unchanged.

Yet another advantage of the present invention is that a magnet divided internally by resistors between the forward going and backward going coils/sections is less sensitive to external disturbances than an unprotected magnet. This is a very important feature of Applicant's invention since active shield magnets are more sensitive than other magnets to external magnetic disturbances: lifts, cars, subways, etc. This "de-sensitization" occurs because in the event of an external disturbance balance currents flow in the resistor protection network which mitigate the effects of the change.

While the invention has been described with reference to a preferred embodiment, it should be understood that this embodiment is exemplary only and is not meant to act as a limitation on the scope of the invention.

What is claimed is:

1. An improved actively shielded magnetic resonance imaging system, which in the event of a quench protects its superconducting coils from burnout as well as keeps the stray field of the system principally unchanged; said system comprising:

an actively shielded magnet and a plurality of protective units;

said actively shield magnet including:

a set of inner magnet coils with forward going current and a set of outer magnet coils with backward going current;

said sets of inner and out magnet coils arranged so that a strong and homogenous magnetic field is generated inside the magnet and a stray field close to zero is generated on the outside of the magnet;

said sets of inner and outer magnet coils electrically arranged in a plurality of coil groups so that the magnitude of the current running through all coils in a group is substantially identical;

said coil groups each comprising at least one coil pair including at least one coil from said set of inner magnet coils and at least one coil from said set of outer magnet coils, both said coils in said pair having the same dipole moment so that the net dipole moment and contribution to the stray field of the magnet from each of said groups is close to zero; and said plurality of protective units each electrically connected in parallel to one of said groups to carry the excess current from said coils in the event of a quench.

2. The system of claim 1 wherein said protective units are resistors.

3. The system of claim 2 wherein said groups of coils each comprises a plurality of coil pairs;

said coil pair including a first coil from said set of inner magnet coils and a second coil from said set of outer magnet coils, both first and second coils in a pair having the same dipole moment, so that the net dipole moment and contribution to stray field of the magnet from said coil pair is always close to zero.

4. The system of claim 2 wherein said coil groups are each comprised of one pair of coils;

said pair of coils including a first coil from said set of inner magnet coils and a second coil from said set of outer magnet coils, both said first and second coils in a pair having the same dipole moment, so that the net dipole moment and contribution to stray field of the magnet from said coil pair is always close to zero.

5. The system of claim 3 wherein said protective resistors each have a resistance of substantially 1–100 ohms.

6. The system of claim 4 wherein said protective resistors each have a resistance of substantially 1–100 ohms.

7. An improved method for protecting an actively shielded magnetic resonance imaging system in the event of a quench by protecting its superconducting coils from burnout as well as keeping the stray field of the system substantially unchanged;

said actively shielding magnet including:
 inner magnet coils with forward going current and outer magnet coils with backward going current;

said method including the following steps:
 arranging said inner and outer magnet coils in a three dimensional space so that a strong and homogenous magnetic field is generated inside the magnet and a stray field close to zero is generated on the outside of the magnet;
 electrically connecting said inner and outer magnet coils in groups of coil pairs so that the magnitude of the current running though all coils in a group is identical, said groups of coil pairs each including at least one coil from said inner magnet coils and at least one coil from said outer magnet coils, such that the net dipole moment and contribution to stray field of the magnet from each of said groups is always close to zero; and
 electrically connecting each of said groups to a protective unit in parallel so as to carry the excess current from said coils in the event of a quench.

8. The method of claim 7 wherein said protective units are resistors.

9. The method of claim 7 wherein said protective units are semi-conductors.

10. The method of claim 7 wherein said groups of coils each comprises a plurality of coil pairs;
 said coil pairs including a first coil from said inner magnet coils and a second coil from said outer magnet coils, both first and second coils in a pair having the same dipole moment, so that the net dipole moment and contribution to stray field of the magnet from said coil pair is always close to zero.

11. The method of claim 7 wherein said groups of coils each comprises a single coil pair;
 said coil pair including a first coil from said inner magnet coils and a second coil from said outer magnet coils, both first and second coils in a pair having the same dipole moment, so that the net dipole moment and contribution to stray field of the magnet from said coil pair is always close to zero.

12. The method of claim 10 wherein said protective units are resistors each having a resistance range of up to 100 ohms.

13. The method of claim 11 wherein said protective units each have a resistance range of up to 100 ohms.

* * * * *